(12) United States Patent
Lee et al.

(10) Patent No.: US 8,679,976 B2
(45) Date of Patent: Mar. 25, 2014

(54) METHOD OF MANUFACTURING GRAPHENE BY USING GERMANIUM LAYER

(75) Inventors: Eun-kyung Lee, Seoul (KR); Byoung-Iyong Choi, Seoul (KR); Dong-mok Whang, Seoul (KR); Jae-hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 483 days.

(21) Appl. No.: 12/976,874

(22) Filed: Dec. 22, 2010

(65) Prior Publication Data

US 2011/0244662 A1 Oct. 6, 2011

(30) Foreign Application Priority Data

Mar. 31, 2010 (KR) .................. 10-2010-0029509

(51) Int. Cl.
*H01L 21/44* (2006.01)
(52) U.S. Cl.
USPC .............................. 438/680; 257/29; 977/734
(58) Field of Classification Search
USPC .................. 257/29; 438/680; 977/734–742
See application file for complete search history.

(56) References Cited

U.S. PATENT DOCUMENTS

| | | | | |
|---|---|---|---|---|
| 8,075,864 B2* | 12/2011 | Choi et al. | .................. | 423/448 |
| 2006/0099773 A1* | 5/2006 | Maa et al. | .................... | 438/455 |
| 2006/0113891 A1* | 6/2006 | Nishimura et al. | .......... | 313/496 |
| 2007/0096304 A1* | 5/2007 | Kabir | ........................... | 257/734 |
| 2008/0242061 A1* | 10/2008 | Simonelli et al. | ............. | 438/494 |
| 2009/0001282 A1* | 1/2009 | Hofmeester et al. | ......... | 250/424 |
| 2009/0061107 A1* | 3/2009 | Sandhu | ....................... | 427/561 |
| 2009/0117467 A1 | 5/2009 | Zhamu et al. | | |
| 2009/0291270 A1* | 11/2009 | Zettl et al. | ................. | 428/195.1 |
| 2010/0255219 A1* | 10/2010 | Wenxu et al. | ................. | 427/596 |
| 2012/0003438 A1* | 1/2012 | Appleton et al. | .......... | 428/195.1 |
| 2012/0074387 A1* | 3/2012 | King | ............................. | 257/29 |

FOREIGN PATENT DOCUMENTS

| | | |
|---|---|---|
| KR | 1020090017454 A | 2/2009 |
| KR | 1020090039229 A | 4/2009 |
| KR | 1020090057205 A | 6/2009 |
| KR | 1020090126057 A | 12/2009 |
| KR | 1020090126058 A | 12/2009 |

* cited by examiner

*Primary Examiner* — Trung Q Dang
(74) *Attorney, Agent, or Firm* — Cantor Colburn LLP

(57) ABSTRACT

A method of manufacturing graphene includes forming a germanium layer on a surface of a substrate, and forming the graphene directly on the germanium layer by supplying carbon-containing gas into a chamber in which the substrate is disposed.

10 Claims, 2 Drawing Sheets

METHOD OF MANUFACTURING GRAPHENE BY USING GERMANIUM LAYER

CROSS-REFERENCE TO RELATED APPLICATIONS

This application claims priority to Korean Patent Application No. 10-2010-0029509, filed on Mar. 31, 2010, and all the benefits accruing therefrom under 35 U.S.C. §119, the disclosure of which is incorporated herein in its entirety by reference.

BACKGROUND

1. Field

Provided are methods of manufacturing graphene, in which graphene is directly grown on a germanium layer or a germanium substrate.

2. Description of the Related Art

Graphene has electrical, mechanical, and chemical stability and excellent conductivity, and is thus noticed as a base material for electronic devices.

Graphene may be manufactured using a chemical vapor deposition ("CVD") method or by pyrolyzing a silicon carbide (SiC) substrate.

However, when using the method of pyrolyzing a SiC substrate, it is difficult to manufacture large-sized graphene. In addition, since the SiC substrate is expensive, the economical efficiency in manufacturing graphene is low.

In the CVD method, a catalyst metal is used to manufacture graphene. Since graphene is planarly formed over a catalyst metal layer, the catalyst metal may be mixed in the graphene. However, it is difficult to remove the catalyst metal from the graphene. Also, it is difficult to remove the catalyst metal even by using a strong acid. A strong acid solution containing metal ions is used to remove the catalyst metal, but the graphene may be polluted due to the metal ions at this time.

Also, if the catalyst metal layer is a polycrystalline metal layer, the solubility of carbon is increased on a grain boundary, and a thickness of graphene on the grain boundary may increase accordingly. If the thickness of the graphene is not uniform, the properties of the graphene are influenced by the thickness of the graphene and thus, the synthesized graphene does not have uniform semiconductor characteristics, and it is difficult to use the above-described graphene to manufacture devices.

SUMMARY

Provided are methods for manufacturing graphene without using a metal catalyst, so that metal impurities are not contained in the manufactured graphene.

Embodiments will be set forth in part in the description which follows and, in part, will be apparent from the description, or may be learned by practice of the illustrated embodiments.

Provided is a method of manufacturing graphene including forming a germanium layer on a substrate, and forming the graphene directly on the germanium layer by supplying carbon-containing gas into a chamber in which the substrate is disposed.

The substrate may include one material selected from the group consisting of silicon, silicon oxide, quartz, glass, plastic, sapphire and a combination thereof.

The graphene may include one to three graphene layers.

The graphene may be formed using a chemical vapor deposition ("CVD") method.

The germanium layer may be a single crystalline or polycrystalline germanium layer.

The germanium layer may have a thickness of about 100 nanometers (nm) to about 10 micrometers (μm).

Provided is a method of manufacturing graphene including supplying carbon-containing gas into a chamber in which a germanium substrate is disposed, and forming graphene directly on the germanium substrate.

The germanium substrate may be a single crystalline substrate.

The method of forming graphene does not use a catalyst metal layer.

Provided is a method of manufacturing graphene including forming a germanium layer directly on an upper surface of a substrate, disposing the substrate including the germanium layer into a chamber, supplying carbon-containing gas into the chamber in which the substrate and the germanium layer are disposed, to form the graphene directly on an upper surface of the germanium layer, disposing a support member on an upper surface of the formed graphene, and removing the germanium layer while the support member is on the upper surface of the formed graphene, to separate the formed graphene from the substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
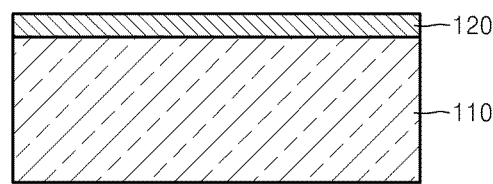
FIGS. 1 and 2 are schematic views illustrating an embodiment of a method of manufacturing graphene, according to the present invention.

Reference will now be made in detail to embodiments, examples of which are illustrated in the accompanying drawings, wherein like reference numerals refer to the like elements throughout. In this regard, the illustrated embodiments may have different forms and should not be construed as being limited to the descriptions set forth herein. Accordingly, the embodiments are merely described below, by referring to the figures, to explain aspects of the present description. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
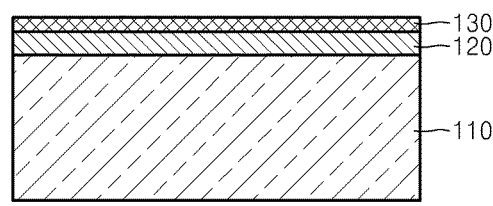

FIGS. 1 and 2 are schematic views illustrating an embodiment of a method of manufacturing graphene, according to the present invention.

Referring to FIG. 1, first, a substrate 110 is disposed in a chamber (not shown). The substrate 110 may be a glass substrate, a sapphire substrate, a silicon substrate, a silicon oxide substrate, or a plastic substrate, but is not limited thereto and may also include other various materials.

Next, a germanium layer 120 is formed directly on an upper surface of the substrate 110, such as by using a chemical vapor deposition ("CVD") method. The germanium layer 120 is formed on an entire of the upper surface of the substrate 110. Gas containing germanium, e.g., $GeH_4$ or $GeCl_4$, is introduced into the chamber. A deposition temperature is about 200° C. to about 900° C., and a total pressure in the chamber is about 1 torr (Torr) to about 300 torr (Torr). The germanium layer 120 may have a thickness of about 100 nanometers (nm) to about 10 micrometers (μm). The thickness is taken in a direction perpendicular to the planar first substrate 110. The germanium layer 120 is a single unitary indivisible layer on the substrate 110.

In alternative embodiments, the germanium layer 120 may also be formed using methods other than the CVD method, for example, such as by using an atomic layer deposition ("ALD") method, a sputtering method, or an electron beam deposition method.

The germanium layer 120 may be a single crystalline layer or a polycrystalline layer.

Referring to FIG. 2, a graphene layer 130 is formed directly on an upper surface of the germanium layer 120, such as by using a CVD method. In order to form the graphene layer 130, carbon-containing gas is introduced into the chamber in which the substrate 110 is disposed. Examples of the carbon-containing gas include $CH_4$, $C_2H_2$, $C_2H_4$, and CO. The graphene layer 130 may have one to three graphene layers, which are formed on the germanium layer 120. The graphene layer 130 is formed on an entire of the upper surface of the germanium layer 120.

Deposition of the graphene layer 130 is conducted in the chamber at about 200° C. to about 1100° C., at a total pressure of the chamber of about 0.1 Torr to about 760 Torr, and for about 10 to about 60 minutes. Germanium has a eutectic temperature with carbon of about 937° C., which is relatively high, and a maximum carbon atoms in a solid solution with germanium is about $10^8$ atoms per cubed centimeter ($cm^3$). That is, the solubility of carbon is very low at a typical deposition temperature of graphene of about 700° C. to about 850° C. Accordingly, carbon is easily extracted from the germanium layer 120. The formed graphene 130 is a single unitary indivisible layer directly on the germanium layer 120.

In the method of manufacturing graphene, according to the illustrated embodiment of the present invention, a catalyst metal layer is not used and thus, the graphene 130 is not polluted by a catalyst metal as in a conventional method of the related art.

Also, since the germanium layer 120 is easily dissolved in a solution such as water, a support member such as a polydimethylsiloxane ("PDMS") may be disposed on the graphene layer 130, such as on an upper surface of the grapheme layer 130 opposing the germanium layer 120. The resultant structure may be put into water to thus easily separate the graphene layer 130 from the substrate 110 by removing the germanium layer 120. Thus, the graphene layer 130 may be easily transferred to another substrate.

In addition, a large-sized graphene layer may be manufactured.

Figure 3:
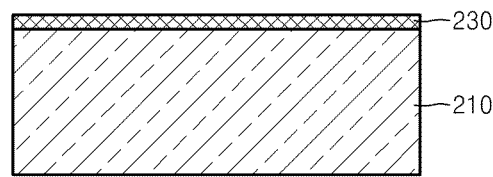
FIG. 3 is a schematic view illustrating another embodiment of a method of manufacturing graphene, according to the present invention.

FIG. 3 is a schematic view illustrating another embodiment of a method of manufacturing graphene, according to the present invention.

Referring to FIG. 3, first, a germanium substrate 210 is disposed in a chamber (not shown), and a graphene layer 230 is directly formed on an upper surface of the germanium substrate 210 such as by using a CVD method. In order to form the graphene layer 230, carbon-containing gas is injected into a chamber in which the substrate 210 is formed. The carbon-containing gas may be, for example, $CH_4$, $C_2H_2$, $C_2H_4$, or CO. One to three individual graphene material layers are formed on the germanium substrate 210 to form the graphene layer 230. The graphene layer 230 is formed on an entire of the upper surface of the germanium substrate 210. Deposition of the graphene layer 230 is conducted in the chamber at about 200° C. to about 900° C., at a total pressure of the chamber of about 0.1 Torr to about 760 Torr, and for about 10 minutes.

The germanium substrate 210 may be a single crystalline substrate.

Figure 4:
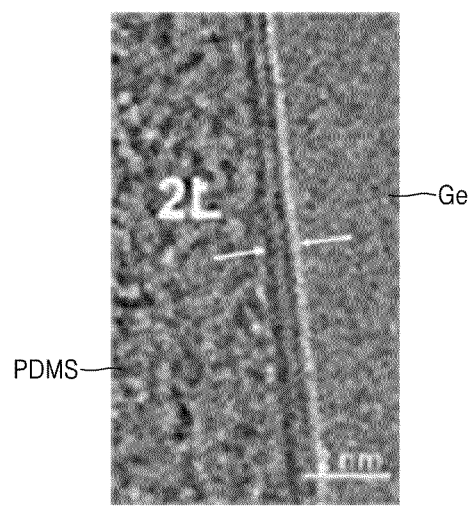
FIG. 4 is a transmission electron microscopy ("TEM") image showing an embodiment of two graphene layers on a germanium layer, according to the present invention of FIG. 3.

FIG. 4 is a transmission electron microscopy ("TEM") image showing two graphene material layers formed on a germanium substrate (Ge), according to the above-described embodiment of the present invention. In order to show the graphene material layers on the germanium substrate Ge clearly, the two graphene material layers are photographed while a support member, polydimethylsiloxane ("PDMS"), is attached on the graphene material layers. In FIG. 4, '2L' denotes the graphene material layers of a two-layer graphene layer structure.

According to the methods of manufacturing graphene, according to the above embodiments of the present invention, a graphene material layer is directly formed on a germanium substrate or a germanium layer, and thus no catalyst metal layer is used. Accordingly, the resulting graphene layer is not polluted, as in the related art, by a catalyst metal. Thus, a graphene layer having high purity may be manufactured.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing graphene, the method comprising:
   forming a germanium layer on a surface of a substrate; and
   forming the graphene directly on the germanium layer using a chemical vapor deposit method by supplying carbon-containing gas into a chamber in which the substrate is disposed.

2. The method of claim 1, wherein the substrate includes one material selected from the group consisting of silicon, silicon oxide, quartz, glass, plastic, sapphire and a combination thereof.

3. The method of claim 1, wherein the graphene includes one to three graphene layers.

4. The method of claim 1, wherein the germanium layer is a single crystalline or polycrystalline germanium layer.

5. The method of claim 4, wherein the germanium layer has a thickness of about 100 nanometers to about 10 micrometers, in a direction perpendicular to the surface of the substrate.

6. A method of manufacturing graphene, the method comprising:
   supplying carbon-containing gas into a chamber in which a germanium substrate is disposed; and
   forming the graphene directly on the germanium substrate using a chemical vapor deposit method.

7. The method of claim 6, wherein the graphene includes one to three graphene layers.

8. The method of claim 6, wherein the germanium substrate is a single crystalline substrate.

9. The method of claim 1, wherein no catalyst metal layer is used in the forming the graphene.

10. A method of manufacturing graphene, the method comprising:
    forming a germanium layer directly on an upper surface of a substrate;
    disposing the substrate including the germanium layer into a chamber;
    supplying carbon-containing gas into the chamber in which the substrate and the germanium layer are disposed, to form the graphene directly on an upper surface of the germanium layer using a chemical vapor deposit method;
    disposing a support member on an upper surface of the formed graphene; and
    removing the germanium layer while the support member is on the upper surface of the formed graphene, to separate the formed graphene from the substrate.

* * * * *